(12) United States Patent
Van Assche et al.

(10) Patent No.: US 9,959,930 B2
(45) Date of Patent: May 1, 2018

(54) METHOD FOR WRITING INTO AND READING FROM AN ATOMICITY MEMORY USING MARKING PATTERN

(75) Inventors: Gilles Van Assche, Schaerbeek (BE); Ronny Van Keer, Hoeilaart (BE)

(73) Assignee: PROTON WORLD INTERNATIONAL N.V., Diegem (BE)

( * ) Notice: Subject to any disclaimer, the term of this patent is extended or adjusted under 35 U.S.C. 154(b) by 1586 days.

(21) Appl. No.: 13/075,488

(22) Filed: Mar. 30, 2011

(65) Prior Publication Data

US 2011/0271042 A1    Nov. 3, 2011

(30) Foreign Application Priority Data

Apr. 30, 2010 (FR) ..................... 10 53379

(51) Int. Cl.
*G06F 12/02* (2006.01)
*G11C 16/10* (2006.01)
*G11C 16/34* (2006.01)

(52) U.S. Cl.
CPC ........ *G11C 16/102* (2013.01); *G06F 12/0246* (2013.01); *G11C 16/105* (2013.01); *G11C 16/349* (2013.01); *G11C 16/3495* (2013.01)

(58) Field of Classification Search
None
See application file for complete search history.

(56) References Cited

U.S. PATENT DOCUMENTS

| | | | |
|---|---|---|---|
| 4,922,456 A | 5/1990 | Naddor et al. | |
| 5,530,827 A | 6/1996 | Matsui et al. | |
| 5,532,463 A | 7/1996 | Debelleix et al. | |
| 5,715,431 A | 2/1998 | Everett et al. | |
| 5,926,826 A * | 7/1999 | Ninomiya et al. | 711/103 |
| 5,956,473 A * | 9/1999 | Ma et al. | 714/5.1 |
| 6,839,798 B1 * | 1/2005 | Nagayoshi et al. | 711/103 |
| 6,973,530 B2 * | 12/2005 | Hurich | 711/103 |
| 7,840,616 B2 * | 11/2010 | Kobayashi | 707/822 |
| 2003/0018862 A1 * | 1/2003 | Karnstedt et al. | 711/156 |
| 2004/0177216 A1 * | 9/2004 | Asari et al. | 711/103 |
| 2006/0106751 A1 * | 5/2006 | Andre et al. | 707/1 |
| 2008/0222350 A1 * | 9/2008 | Chang | 711/103 |
| 2009/0013122 A1 * | 1/2009 | Sepe et al. | 711/103 |
| 2010/0039860 A1 * | 2/2010 | Ruby et al. | 365/185.11 |
| 2011/0004720 A1 * | 1/2011 | Chiang et al. | 711/103 |

FOREIGN PATENT DOCUMENTS

| | | |
|---|---|---|
| EP | 0340981 A2 | 11/1989 |
| EP | 0398545 A1 | 11/1990 |
| EP | 0863513 A2 | 9/1998 |
| EP | 1241677 A1 | 9/2002 |

OTHER PUBLICATIONS

French Search Report from French Patent Application No. 1053379 dated Dec. 16, 2010.

* cited by examiner

*Primary Examiner* — Arpan P. Savla
(74) *Attorney, Agent, or Firm* — Seed IP Law Group LLP

(57) ABSTRACT

A method for writing data into a reprogrammable non-volatile memory, wherein a marking pattern including several bits is added at the beginning of the data and the set formed of the marking pattern and of the data is written from an address in the memory varying from one write operation to another, the marking pattern being identical for each write operation.

28 Claims, 1 Drawing Sheet

METHOD FOR WRITING INTO AND READING FROM AN ATOMICITY MEMORY USING MARKING PATTERN

CROSS REFERENCE TO RELATED APPLICATIONS

This application claims the priority benefit of French patent application number 10/53379, filed on Apr. 30, 2010, entitled "METHOD FOR WRITING INTO AND READING FROM AN ATOMICITY MEMORY," which is hereby incorporated by reference to the maximum extent allowable by law.

BACKGROUND OF THE INVENTION

Field of the Invention

The present invention relates to the field of microcontrollers embedded in electronic elements and to the implementation of atomic transactions in such devices. More specifically, the present invention relates to a method for writing into or reading from an atomicity memory.

Discussion of the Related Art

In embedded microcontrollers, for example, contact or contactless chip cards, the atomicity of transactions is essential. A transaction is said to be atomic if, when it is under way and an interrupt occurs, for example, due to an interruption of the device power supply, the data stored in a non-volatile memory are, after the device has been reactivated, either in the state prior to the transaction, or in the final state after the transaction. If the state of several sets of memory cells has to be changed during a transaction, all the memory cells should be updated or reset to their state prior to the transaction. For an atomic transaction, an intermediary or undetermined state of areas storing the data of this transaction in the non-volatile memory must not be allowed.

Many techniques are known to determine whether a transaction has occurred properly and whether the state of the non-volatile memories to which it has been accessed has been updated properly. To perform atomic transactions, it is current to use a memory area of the non-volatile memory, which is called "atomicity memory (or buffer)", to store, before each transaction, the state of the non-volatile memories capable of being modified during the transaction. This enables, in the case where the transaction would be interrupted, to restore in non-volatile memories all the data preceding the transaction by reinjecting the data stored in the atomicity buffer. It is also known to store, in an atomicity buffer and before each transaction, the new data intended to be stored in the non-volatile memories at the end of the transaction. If the transaction is interrupted, the data stored in the atomicity buffer enable to complete the transaction.

In the case where the transaction has succeeded, the data contained in the atomicity buffer are erased. Generally, atomicity buffers are formed of electrically erasable and programmable non-volatile memories, better known as EEPROMs.

A problem of the use of EEPROMs is that such memories are unable to withstand a number of write operations greater than 500,000 cycles and tend to degrade along write and erase operations. Further, the degradation of the buffer memories is not uniform since the number of data to be written into the atomicity buffer varies according to the performed transactions. Thus, the first memory areas (first memory addresses) of the atomicity buffer are reached for each transaction while the last memory areas are only used in transactions modifying the state of a large number of memory cells.

Thus, a buffer formed of EEPROMs non-uniformly degrades along write and read operations.

SUMMARY OF THE INVENTION

An object of an embodiment is to overcome all or part of the disadvantages of usual atomicity buffers. More specifically, an object of an embodiment of the present invention is to provide an atomicity buffer formed of EEPROMs having a state capable of being modified a large number of times.

Another object of an embodiment is to provide a method for writing data into an atomicity buffer formed of EEPROMs.

Another object of an embodiment is to provide a method for reading data from an atomicity buffer formed of EEPROMs.

Thus, an embodiment provides a method for writing data into a reprogrammable non-volatile memory, wherein: a marking pattern comprising several bits is added at the beginning of the data; and the set formed of the marking pattern and of the data is written from an address in the memory varying from one write operation to another, the marking pattern being identical for each write operation.

According to an embodiment, information associated with the data is added in the set, between the marking pattern and the data.

According to an embodiment, information associated with the data is interleaved in the marking pattern.

According to an embodiment, the marking pattern comprises at least 64 bits.

According to an embodiment, the marking pattern comprises at least 128 bits.

According to an embodiment, the reprogrammable non-volatile memory is an atomicity memory.

Another embodiment further provides a method for reading data from a reprogrammable non-volatile memory, the data being written according to the above-described method, comprising a memory scan step to recognize the marking pattern and a step of reading the stored data from the memory addresses following the marking pattern.

According to an embodiment, the reading is performed according to a circular addressing.

An embodiment further provides an electronic circuit comprising a reprogrammable non-volatile memory having areas written into according to the above-described method, further comprising means for storing a marking pattern.

The foregoing objects, features, and advantages will be discussed in detail in the following non-limiting description of specific embodiments in connection with the accompanying drawings.

DETAILED DESCRIPTION

To avoid that the EEPROM of an atomicity memory (or buffer) formed in a non-volatile data storage memory is prematurely degraded due to the large number of accesses to this memory, the present inventors provide performing a write operation in the atomicity buffer, from a first address of the atomicity buffer varying from one write operation to another. Thus, along the write and read operations, all the addresses in the memory forming the atomicity buffer are statistically written into, read from and/or erased a same number of times. This enables increasing the lifetime of the atomicity buffer.

To enable the reading of the data stored in the atomicity buffer, it is provided, before the writing of the data into the buffer, to store a pattern marking the beginning of the writing into the buffer. This pattern is a sequence of bits selected, for example, randomly, under control of a program associated with the device in which atomic transactions are desired. The marking pattern may also be selected, randomly or not, during the customization of the device integrating the memory or when the program is launched on the device for the first time.

Such a write method is thus compatible with the fact that the data to be stored in the memory have a variable size for each transaction.

Figure 1:
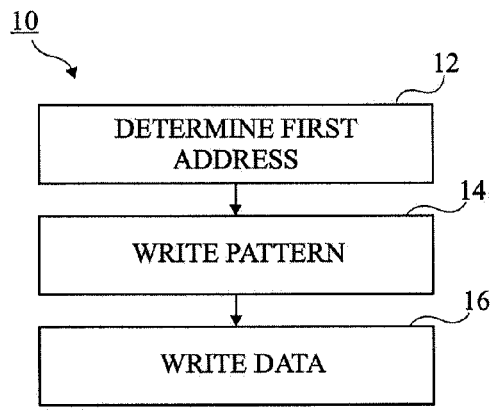
FIG. 1 is a flowchart illustrating a method for writing into an atomicity buffer according to an embodiment of the present invention.

FIG. 1 is a flowchart illustrating a method 10 for writing into an atomicity buffer.

A first step 12 of the write method (DETERMINE FIRST ADDRESS) comprises determining a first address in the buffer, from which the data will be stored. This determination may be carried out by any known means, for example, a random address generator. At a next step 14 (WRITE PATTERN), a pattern marking the beginning of the writing is stored in the atomicity buffer, from the address determined at step 12. A last step 16 of the write method (WRITE DATA) comprises writing the data to be stored into the atomicity buffer, from the address following the next address used to store the pattern marking the beginning of the writing.

Figure 2:
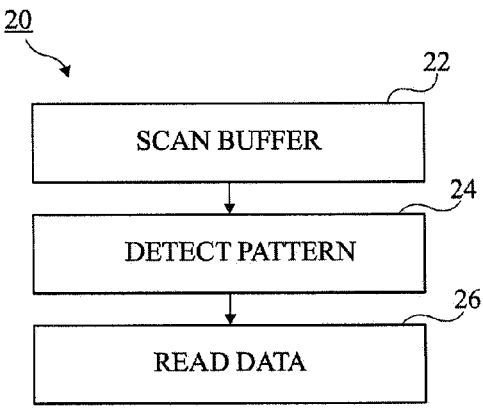
FIG. 2 is a flowchart illustrating a method for reading from an atomicity buffer according to an embodiment of the present invention.

FIG. 2 is a flowchart illustrating a method 20 for reading from an atomicity buffer into which data have been written according to the method illustrated in FIG. 1.

A first step 22 of the read method (SCAN BUFFER) comprises scanning the data contained in the atomicity buffer. This step enables, in association with a second step 24 (DETECT PATTERN), to detect the presence of the pattern marking the beginning of the writing. A last step (READ DATA) comprises moving to the end of the marking pattern to read the data stored in the atomicity buffer.

To avoid risking confusing the pattern marking the beginning of the writing with the data written at step 16, the marking pattern should comprise a large number of bits. With a marking pattern comprising some thirty bits, the probability for the data to reproduce the marking pattern already is on the order of $10^{-9}$. Preferably, the pattern marking the beginning of the writing comprises 64 bits, or even 128 bits. This pattern will preferably be stored in a secret location of the chip where the atomicity buffer is provided. A marking pattern comprising a large number of bits also enables avoiding for an ill-meaning person to discover it and to use it to modify states of the memory and/or to obtain secret information.

It should be noted that the atomicity buffer will have to be provided of a sufficient size to store at least the maximum number of data to be stored during a transaction, plus the elements of the marking pattern. To further decrease the degradation along time, the atomicity buffer may also be formed of an area of the non-volatile data storage memory comprising a number of memories greater than the number of memory addresses necessary to store the largest possible number of data to be stored during a transaction. Indeed, since all the addresses of the atomicity buffer are statistically used a same number of times, the use of a buffer comprising a large number of memory addresses limits the access and thus the wear of each of the EEPROMs forming it.

Figure 3:
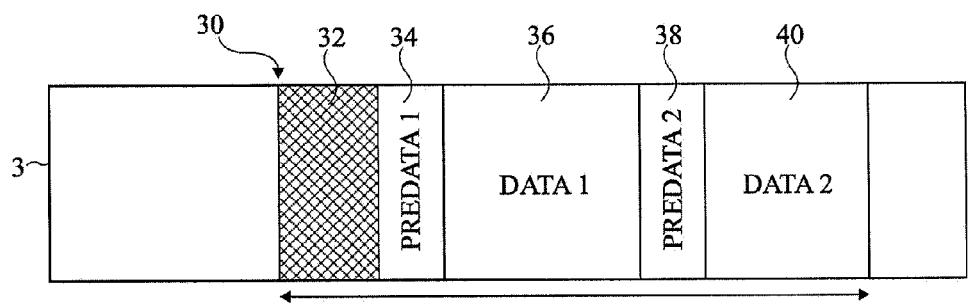
FIG. 3 illustrates an atomicity buffer into which data are written according to an embodiment of the present invention.

FIG. 3 illustrates an atomicity buffer 3 in which data are stored according to the method of FIG. 1.

Data 32 forming the pattern marking the beginning of the writing are stored from a beginning address 30, for example randomly selected. Then, in the order of the addresses of the atomicity buffer, the actual data to be stored are stored. In the shown example, two sets of data are shown. The first set of data comprises "pre-data" 34 (PREDATA1) and data 36 (DATA1). The second set of data comprises "pre-data" 38 (PREDATA2) and data 40 (DATA2).

As an example, pre-data 34 and 38 may be information relative to the associated set of data, for example, address data, cyclic redundancy check codes (known as CRC), information relative to the length of the data. Data 36 and 40 correspond to the data really stored in the memory before the transaction is implemented.

Figure 4:
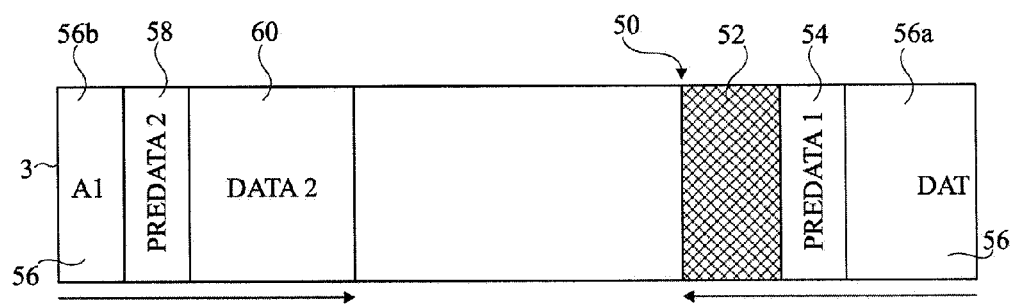
FIG. 4 illustrates another configuration of the atomicity buffer of FIG. 3 in which data are written according to an embodiment of the present invention.

FIG. 4 illustrates another configuration of atomicity buffer 3 of FIG. 3 into which data are written according to the method of FIG. 1.

In the case of FIG. 4, storage beginning address 50 is such that the size of the data to be stored is greater than the memory volume remaining before the end of the buffer, that is, before its last address. A circular addressing is then performed to return to the beginning of the buffer. Thus, a first set of memory addresses 52 of the atomicity buffer stores the pattern marking the beginning of the writing. Then, the actual data to be stored are stored in the order of the addresses of the atomicity buffer. In the shown example, two sets of data are stored. The first set of data comprises "pre-data" 54 (PREDATA1) and data 56 (DATA1). The second set of data comprises "pre-data" 58 (PREDATA2) and data 60 (DATA2). In the example of FIG. 4, data 56 are stored in two portions, a first portion 56a at the level of the last buffer addresses and a second portion 56b from the beginning of the buffer.

Thus, in the case of FIG. 4, the stored data are stored according to a circular addressing. Similarly, the reading of the data at step 26 will be performed according to a circular addressing, and so will atomicity buffer scan step 22. It should be noted that the pattern marking the beginning of the writing may also be integrated into pre-data, in one or several portions, or that the marking pattern or the pre-data may be stored in two portions in the buffer.

Specific embodiments of the present invention have been described. Various alterations and modifications will occur to those skilled in the art. In particular, buffers in which two sets of data are stored before a transaction is performed have been shown in FIGS. 3 and 4. It should be noted that the atomicity buffers may, during the lifetime of the card in which they are integrated, store a variable number of data sets. Buffers in which a single set of "pre-data" will be provided for several sets of data may also be provided. Further, the pre-data may comprise other elements than those mentioned herein.

Finally, the step of determination of first variable write address 12 and the step of scanning of atomicity buffer 22 may be carried out by means of any device capable of implementing these steps, for example, by the microcontroller associated with a chip card.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method, comprising:
    writing a plurality of data sets to a reprogrammable non-volatile memory using circular addressing, each data set including a marking pattern comprising a plurality of bits to mark a write-start address of the data set and respective data, the circular memory having a size greater than a size of a largest data set of the plurality, the writing of a respective data set of the plurality including:
        randomly selecting a starting address in the reprogrammable non-volatile memory;
        writing the marking pattern comprising the plurality of bits to the reprogrammable non-volatile memory; and
        writing the data of the data set to the reprogrammable non-volatile memory, wherein the data set comprising the marking pattern and respective data is written to a plurality of addresses starting from the starting address, with the marking pattern being at a beginning of the set and identical for each data set of the plurality of data sets.

2. The method of claim 1, wherein information associated with said data is added in said set between the marking pattern and said data.

3. The method of claim 1, wherein information associated with said data is interleaved in said marking pattern.

4. The method of claim 1, wherein the marking pattern comprises at least 64 bits.

5. The method of claim 1, wherein the marking pattern comprises at least 128 bits.

6. The method of claim 1, wherein the reprogrammable non-volatile memory is an atomicity memory.

7. The method of claim 1, comprising:
    reading data from the reprogrammable non-volatile memory, the reading including:
        scanning the memory to recognize said marking pattern; and
        reading data from memory addresses following said marking pattern.

8. The method of claim 7, wherein the reading is performed according to a circular addressing.

9. An electronic circuit comprising:
    a reprogrammable non-volatile memory; and
    control circuitry, which, in operation and using circular addressing, controls writing of data sets to the memory, each data set including a marking pattern comprising a plurality of bits to mark a write-start address of the data set and respective data, the writing of each data set to the memory including:
        randomly selecting an address in the reprogrammable non-volatile memory as the write-start address of the data set;
        writing the marking pattern comprising the plurality of bits to the reprogrammable non-volatile memory; and
        writing the data of the data set to the reprogrammable non-volatile memory, wherein the data set comprising the marking pattern and respective data is written to a plurality of addresses starting from the randomly selected write-start address of the data set in the reprogrammable non-volatile memory, with the marking pattern being at a beginning of the set and identical for each data set.

10. The electronic circuit of claim 9, wherein:
    the reprogrammable non-volatile memory comprises an atomicity buffer storing a plurality of sets of the marking pattern and data.

11. The electronic circuit of claim 9, wherein:
    information associated with data of a set is added between the marking pattern and the data of the set.

12. The electronic circuit of claim 9, wherein:
    information associated with data of a set is interleaved in the marking pattern of the set.

13. The electronic circuit of claim 9, wherein:
    the plurality of bits comprise at least 64 bits.

14. The electronic circuit of claim 9, wherein:
    the plurality of bits comprise at least 128 bits.

15. The electronic circuit of claim 9 wherein, in operation, the control circuitry controls read operations from the reprogrammable non-volatile memory, a read operation comprising:
    locating a marking pattern stored in the reprogrammable non-volatile memory; and
    reading data stored in the set including the located marking pattern.

16. The electronic circuit of claim 15, wherein:
    the control circuitry, in operation, uses circular addressing to control read operations from the memory.

17. The method of claim 1, wherein:
    the plurality of bits of the marking pattern are selected randomly.

18. The method of claim 1, wherein:
    the marking pattern comprises information associated with the data.

19. A method, comprising:
    performing at least one first write operation to a reprogrammable non-volatile memory employing circular addresses, the at least one first write operation including:
        randomly determining a first starting address in the reprogrammable non-volatile memory;
        writing a marking pattern comprising a plurality of bits to the reprogrammable non-volatile memory; and
        writing first data to the reprogrammable non-volatile memory, the marking pattern and the first data together forming a first data set stored, starting at the first starting address, in a first plurality of addresses of the reprogrammable non-volatile memory with the marking pattern positioned at a beginning of the first data set; and
    performing at least one second write operation to the reprogrammable non-volatile memory, the at least one second write operation including:
        randomly determining a second starting address in the reprogrammable non-volatile memory;
        writing the marking pattern to the reprogrammable non-volatile memory; and
        writing second data to the reprogrammable non-volatile memory, the marking pattern and the second data together forming a second data set stored, starting at the second starting address, in a second plurality of addresses of the reprogrammable non-volatile memory with the marking pattern positioned at a beginning of the second data set.

20. The method of claim 19, wherein:
the reprogrammable non-volatile memory comprises an atomicity buffer storing a plurality of sets of the marking pattern and data.

21. The method of claim 19 wherein:
information associated with data selected from the group consisting of the first data and the second data is added to a data set between the marking pattern and data of the set.

22. The method of claim 19 wherein:
information associated with data selected from the group consisting of the first data and the second data is interleaved in the marking pattern.

23. The method of claim 19, wherein:
the plurality of bits comprise at least 128 bits.

24. The method of claim 19, comprising:
reading the first data from the reprogrammable non-volatile memory, the reading including:
   locating the marking pattern of the first data set stored in the reprogrammable non-volatile memory; and
   reading the first data of the first data set from the reprogrammable non-volatile memory.

25. The method of claim 24, wherein:
the reading of the first data set is performed according to a circular addressing.

26. The method of claim 19, comprising:
reading of the second data from the reprogrammable non-volatile memory, the reading including:
   locating the marking pattern in the second data set stored in the reprogrammable non-volatile memory; and
   reading the second data of the second data set from the reprogrammable non-volatile memory.

27. The method of claim 26, wherein:
the reading of the second data is performed according to a circular addressing.

28. The electronic circuit of claim 9 wherein the control circuitry is configured to form data sets including the marking pattern and respective data.

* * * * *